US010244623B2

(12) United States Patent
Mohammed et al.

(10) Patent No.: US 10,244,623 B2
(45) Date of Patent: Mar. 26, 2019

(54) STRETCHABLE PRINTED ELECTRONIC SHEETS TO ELECTRICALLY CONNECT UNEVEN TWO DIMENSIONAL AND THREE DIMENSIONAL SURFACES

(71) Applicant: FLEXTRONICS AP, LLC, San Diego, CA (US)

(72) Inventors: Anwar Mohammed, San Jose, CA (US); Weifeng Liu, Dublin, CA (US); Murad Kurwa, San Jose, CA (US)

(73) Assignee: FLEXTRONICS AP, LLC, San Jose, CA (US)

( * ) Notice: Subject to any disclaimer, the term of this patent is extended or adjusted under 35 U.S.C. 154(b) by 59 days.

(21) Appl. No.: 15/196,280

(22) Filed: Jun. 29, 2016

(65) Prior Publication Data

US 2016/0309584 A1 Oct. 20, 2016

Related U.S. Application Data

(63) Continuation of application No. 14/558,357, filed on Dec. 2, 2014, now Pat. No. 9,398,705.

(51) Int. Cl.
| | |
|---|---|
| *B33Y 10/00* | (2015.01) |
| *B33Y 80/00* | (2015.01) |
| *H05K 1/02* | (2006.01) |
| *H05K 1/09* | (2006.01) |
| *H05K 3/00* | (2006.01) |
| *H05K 3/12* | (2006.01) |
| *H05K 3/20* | (2006.01) |
| *B29C 65/72* | (2006.01) |
| *B29L 31/34* | (2006.01) |

(52) U.S. Cl.
CPC .......... *H05K 1/0283* (2013.01); *B29C 65/72* (2013.01); *B33Y 10/00* (2014.12); *B33Y 80/00* (2014.12); *H05K 1/0284* (2013.01); *H05K 1/0296* (2013.01); *H05K 1/092* (2013.01); *H05K 3/0058* (2013.01); *H05K 3/125* (2013.01); *H05K 3/20* (2013.01); *B29L 2031/3425* (2013.01); *H05K 1/028* (2013.01); *H05K 2201/0133* (2013.01); *H05K 2201/0323* (2013.01)

(58) Field of Classification Search
CPC .... H05K 1/028; H05K 1/0283; H05K 1/0284; H05K 1/0296; H05K 1/092; H05K 2201/0133; H05K 2201/0323; H05K 3/0058; H05K 3/125; H05K 3/20; B29C 65/72; B29L 2031/3425; B33Y 10/00; B33Y 80/00
USPC ......................................... 156/277
See application file for complete search history.

(56) References Cited

U.S. PATENT DOCUMENTS 4,250,217 A 2/1981 Greenaway
4,869,767 A * 9/1989 Robinson ............... H05K 3/046
156/233

(Continued)

*Primary Examiner* — Sonya M Sengupta
(74) *Attorney, Agent, or Firm* — Volpe and Koenig, P.C.

(57) ABSTRACT

A method and apparatus for forming a circuit on an uneven two-dimensional (2-D) or three-dimensional (3-D) surface of an object is described. An amount of electrically conductive material to form a circuit between two points on the object is determined. The determined amount of electrically conductive material is deposited on a first surface of a stretchable substrate. The stretchable substrate with the deposited electrically conductive material is applied to the object to form a circuit between two points on the object.

9 Claims, 4 Drawing Sheets

(56) References Cited

U.S. PATENT DOCUMENTS

| | | | | |
|---|---|---|---|---|
| 5,264,061 A | * | 11/1993 | Juskey | H05K 3/0014 |
| | | | | 156/214 |
| 5,529,829 A | | 6/1996 | Koskenmaki et al. | |
| 6,020,862 A | * | 2/2000 | Newton | H01Q 1/38 |
| | | | | 174/255 |
| 2004/0012112 A1 | * | 1/2004 | Davidson | B29C 41/12 |
| | | | | 264/109 |
| 2005/0210666 A1 | * | 9/2005 | Morooka | H01L 31/18 |
| | | | | 29/739 |
| 2008/0157235 A1 | * | 7/2008 | Rogers | H01L 21/8258 |
| | | | | 257/415 |
| 2012/0064290 A1 | | 3/2012 | Esat et al. | |

\* cited by examiner

STRETCHABLE PRINTED ELECTRONIC SHEETS TO ELECTRICALLY CONNECT UNEVEN TWO DIMENSIONAL AND THREE DIMENSIONAL SURFACES

CROSS REFERENCE TO RELATED APPLICATION

This application is a continuation of U.S. patent application Ser. No. 14/558,357, filed Dec. 2, 2014, which is incorporated by reference as if fully set forth.

FIELD OF INVENTION

The present disclosure relates generally to printing onto stretchable substrates to electrically connect uneven two-dimensional and three-dimensional surfaces, and more particularly to methods and apparatus for printing stretchable conductive materials onto uneven two-dimensional and three-dimensional surfaces.

BACKGROUND

Three-dimensional printing ("3-D printing"), also known as additive manufacturing (i.e., the industrial version of 3-D printing), has been applied in product development, rapid prototyping, and specialized manufacturing to create various 3-D objects, such as automotive parts, medical implants, jewelry, eyewear, consumer products, pharmaceuticals, and the like. These 3-D objects often have uneven two-dimensional ("2-D") and 3-D surfaces.

Some 3-D objects may require 2-D and 3-D surfaces that include electrical components. These electrical components, such as sensors and the like, may need to be electrically connected. Current methods of adding electrical components and their connections to the surfaces of 3-D objects are intricate, require extensive skilled labor costs, and are highly expensive. This is especially the case when those 3-D and 2-D surfaces are uneven. Thus, cost-effective methods and apparatus for electrically connecting uneven two-dimensional and three-dimensional surfaces of a 3-D object are desired.

SUMMARY

A method and apparatus for forming a circuit on an uneven two-dimensional (2-D) or three-dimensional (3-D) surface of an object is described. An amount of electrically conductive material to form a circuit between two points on the object is determined. The determined amount of electrically conductive material is deposited on a first surface of a stretchable substrate. The stretchable substrate with the deposited electrically conductive material is applied to the object to form a circuit between two points on the object.

DETAILED DESCRIPTION OF THE PREFERRED EMBODIMENT(S)

Figure 1:
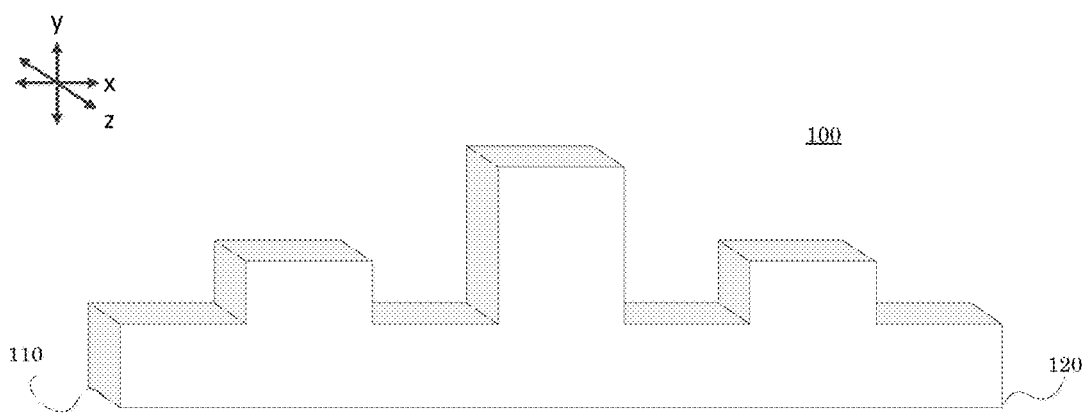
FIG. 1 is a diagram of an example 3-D object having uneven surfaces.

It is to be understood that the figures and descriptions of embodiments of stretchable printed electronic sheets to electrically connect uneven two-dimensional and three-dimensional surfaces have been simplified to illustrate elements that are relevant for a clear understanding, while eliminating, for the purpose of clarity, many other elements found in typical printing systems and electronics. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

The non-limiting embodiments described herein are with respect to a system and method for printing stretchable electronic sheets to electrically connect uneven two-dimensional and three-dimensional surfaces. Other electronic devices, modules and applications may also be used in view of these teachings without deviating from the spirit or scope as described herein. The systems and methods described herein may be modified for a variety of applications and uses while remaining within the spirit and scope of the claims. The embodiments and variations described herein, and/or shown in the drawings, are presented by way of example only and are not limiting as to the scope and spirit. The descriptions herein may be applicable to all embodiments of the stretchable printed electronic sheets to electrically connect uneven two-dimensional and three-dimensional surfaces, although it may be described with respect to a particular embodiment.

FIG. 1 is a diagram of an example 3-D object 100 having uneven surfaces. As shown in FIG. 1, the top surface of the example 3-D object 100 is uneven, as it includes various peaks and valleys of different sizes. In an example application, it may be desirable to form a circuit or conductor that travels between two selected points 110, 120 extending over a distance of the uneven top surface of 3-D object 100.

Figure 2:
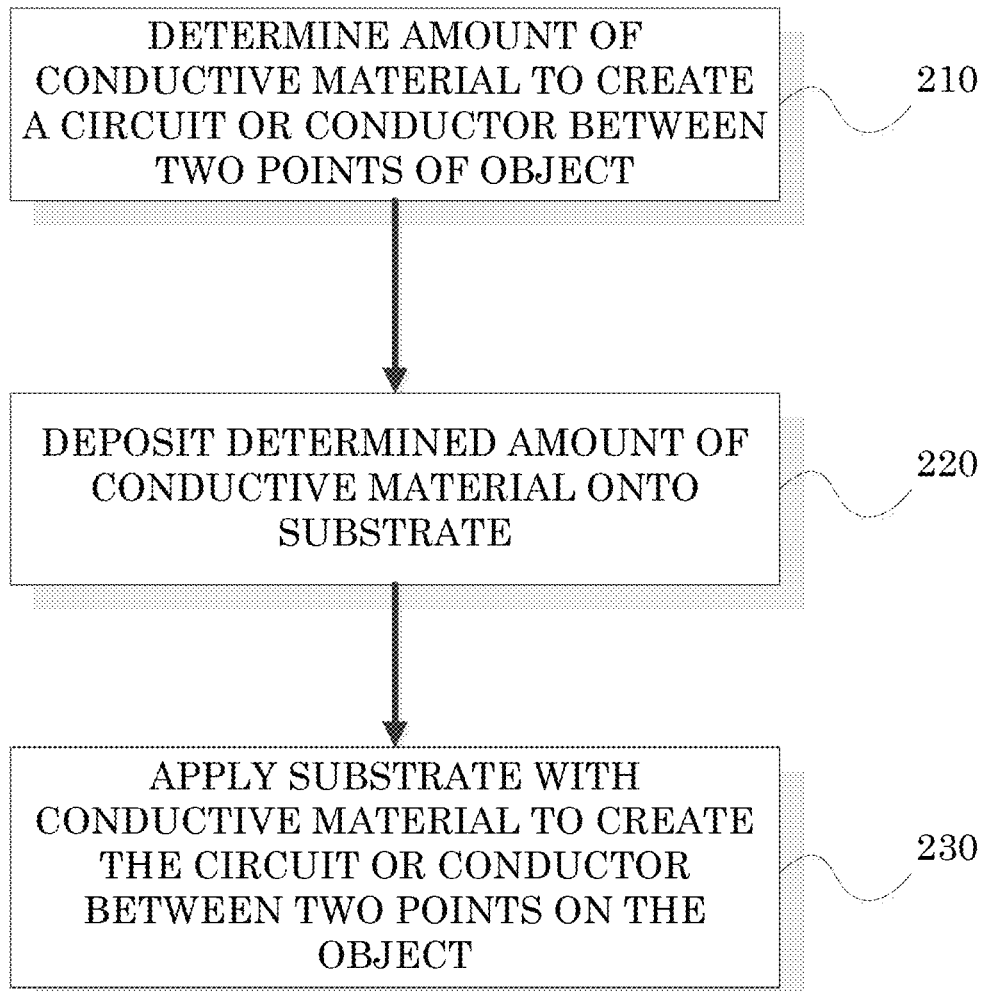
FIG. 2 is a flow diagram of a method for forming a circuit or conductor on an uneven 2-D or 3-D surface.

FIG. 2 is a flow diagram of a method in accordance with one embodiment of the present invention for forming a circuit or conductor on an uneven 2-D or 3-D surface, such as the example 3-D object 100 provided in FIG. 1. Referring to FIG. 2, at step 210, the amount of conductive material needed to create a circuit or conductor between two points of an object is determined. This step may include measuring the length of the uneven surfaces between two selected points on the surface of the object and calculating a required volume of conductive material needed to form a circuit or conductor over the measured length. Alternatively, this step may include measuring the overall geometrical parameters of a patterned circuit, such as a horseshoe pattern, over the length of the uneven surface between two selected points on the surface of the object and calculating a required volume of conductive material needed to form a circuit or conductor having such a pattern.

Figure 3:
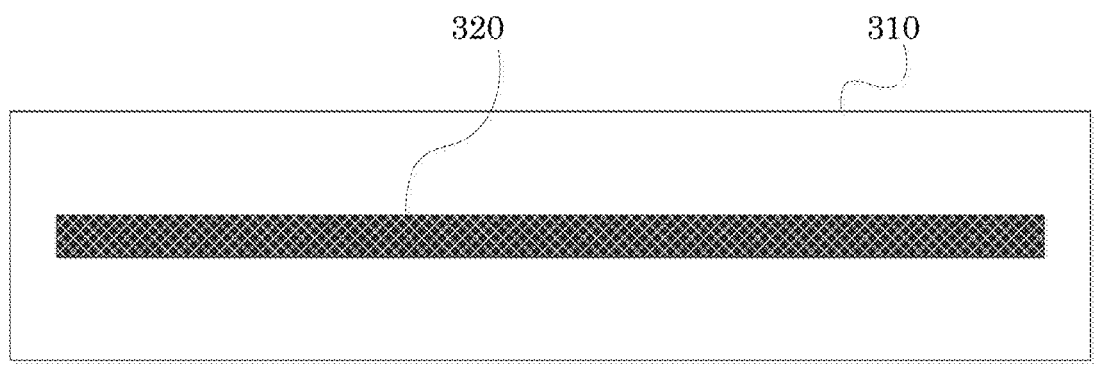
FIG. 3 is a diagram of an example substrate with a deposited continuous strip of conductive material.

At step 220, the determined length of conductive material may be deposited onto a substrate. FIG. 3 is a diagram of an example substrate 310 with a deposited continuous strip of conductive material 320. The conductive material may be deposited in a variety of ways. For example, the conductive material may be deposited by an inkjet printer in the form of a continuous strip of printed conductive ink. An inkjet printer is a device that is generally used to dispense small amounts of ink onto a surface. Conductive ink is a type of ink that includes conductive particles such as powdered or flaked silver and/or carbon like particles, and the like. An inkjet printer using conductive ink may be used to dispense various conductive trace patterns forming a continuous circuit or conductor onto a wide range of surface materials.

In another embodiment, the conductive material may be deposited by an embedded 3-D printer. An embedded 3-D printer is a device that may be used to extrude conductive ink through a deposition needle directly into a reservoir area within a substrate, rather than on the substrate's surface. It should be noted that other methods of depositing conductive material may be used.

Different conductive inks having different properties may also be used. For example, some conductive inks may be stretchable, flexible, compressible and creasable when "cured," and may effectively maintain their levels of performance, reliability, and functionality when stretched, flexed, compressed, or creased. Different substrate materials having different properties may also be used. For example, the substrate materials may be elastomeric materials of varying thickness that allow the substrate to stretch, flex, crease, and the like.

Figure 4:
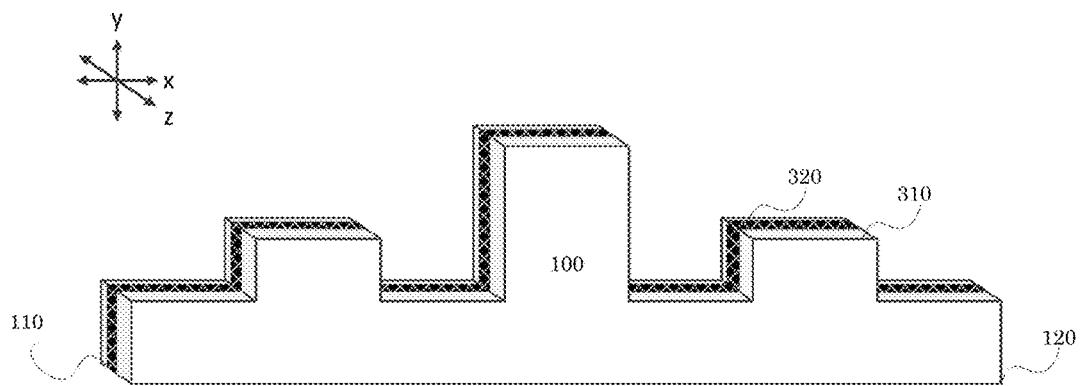
FIG. 4 is a diagram of the example substrate with the deposited continuous strip of conductive material of FIG. 3 applied to the 3-D object of FIG. 1.

Referring back to FIG. 2, at step 230, the substrate with conductive material may be applied to the object to create a circuit or conductor between two points on the object. FIG. 4 is a diagram of the example substrate with the deposited continuous strip of conductive material of FIG. 3 applied to the 3-D object of FIG. 1. As shown in FIG. 4, the substrate 310 with the deposited continuous strip of conductive material 320 connects points 110 and 120 of 3-D object 100. The substrate 310 with the deposited continuous strip of conductive material 320 extends over the uneven top surface of 3D-object 100. The substrate 310 with the deposited strip of conductive material 320 may be applied to 3-D object 100 in a variety of ways. For example, the substrate may be laminated to the uneven surface of the object. In addition, the substrate may be attached to the uneven surface of the object using an adhesive.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the systems described herein, and are considered to be within the full scope of the invention.

Although features and elements are described above in particular combinations, each feature or element can be used alone without the other features and elements or in various combinations with or without other features and elements.

What is claimed is:

1. A system for electrically connecting uneven two-dimensional (2-D) or three-dimensional (3-D) surfaces of an object, comprising:
    a printer;
    a stretchable substrate comprising a first surface and a second surface;
    a conductive material; and
    the object, wherein
    an amount of the conductive material required is based on a length between two points on a surface of the object,
    the surface of the object includes at least an uneven surface,
    the printer deposits the conductive material on the first surface of the stretchable substrate, and
    the second surface of the stretchable substrate mates with the object.

2. The system of claim 1, wherein the amount of the conductive material deposited is based on a calculated volume of the amount of the conductive material required to electrically connect the two points of the object.

3. The system of claim 1, wherein the conductive material is a stretchable conductive material.

4. The system of claim 1, wherein the conductive material forms a patterned circuit on the stretchable substrate.

5. The system of claim 4, wherein the patterned circuit is a horseshoe patterned circuit.

6. The system of claim 1, wherein the conductive material is conductive ink.

7. The system of claim 6, wherein the conductive ink includes conductive particles.

8. The system of claim 1, wherein the second surface of the stretchable substrate includes an adhesive material.

9. The system of claim 1, wherein the printer is a 3-D printer and the 3-D printer further deposits the conductive material into a reservoir area within the stretchable substrate.

* * * * *